United States Patent [19]

Germano et al.

[11] E Re. 30,652

[45] Reissued Jun. 16, 1981

[54] METHOD FOR CONSTRUCTING A THERMOELECTRIC MODULE AND THE MODULE SO OBTAINED

[75] Inventors: Giovanni Germano; Francesco Losciale, both of Rome; Roberto Falesiedi, Piansano; Ferruccio Dacion, Grottaferrat; Nicola Merzagora, Rome, all of Italy

[73] Assignee: Snamprogetti S.p.A., Milan, Italy

[21] Appl. No.: 968,920

[22] Filed: Dec. 13, 1978

Related U.S. Patent Documents

Reissue of:

[64] Patent No.: 4,081,895
Issued: Apr. 4, 1978
Appl. No.: 724,544
Filed: Sep. 20, 1976

[30] Foreign Application Priority Data

Sep. 30, 1975 [IT] Italy ..... 27777 A/75

[51] Int. Cl.[2] ..... H01L 23/56

[52] U.S. Cl. ..... 357/28; 29/573; 75/165; 357/87; 357/67

[58] Field of Search ..... 357/67, 87; 29/573, 29/583, 591; 75/165

[56] References Cited

U.S. PATENT DOCUMENTS 3,958,324 5/1976 Alais ..... 29/573

*Primary Examiner*—W. C. Tupman

*Attorney, Agent, or Firm*—Morgan, Finnegan, Pine, Foley & Lee

[57] ABSTRACT

This invention relates to a method for constructing a thermoelectric module, as well as to the module so obtained. The method according to the invention comprises the steps of construction a reference shoulder on the semiconductor bar, assembling the semiconductor bars in series by using an insulating cement, cleaning the surfaces, gold plating, nickel plating, brasing copper electrodes, machining the regions between the elements which have to remain insulated, protecting the copper electrodes by nickel or chromium plating. The thermoelectric module so obtained consists of a matrix of semiconductor elements with all the mechanical and electrical connections incorporated, including the input and output terminals.

3 Claims, 3 Drawing Figures

METHOD FOR CONSTRUCTING A THERMOELECTRIC MODULE AND THE MODULE SO OBTAINED

Matter enclosed in heavy brackets [ ] appears in the original patent but forms no part of this reissue specification; matter printed in italics indicates the additions made by reissue.

This invention relates to a method for constructing a thermoelectric module, and the module so obtained. More particularly, this invention relates to a method for making the electrical contacts and mechanical connections necessary for assembling the various semiconductor bars in constructing a module suitable for use in a generator or in a thermoelectric cooling device.

In constructing these modules, various bars of suitable N and P semiconductor materials are connected in series until the so-called module for thermoelectric energy conversion is obtained.

In these modules it is essential to take care that each element undergoes maximum heat exchange with the hot or cold source, that the connections between the various bars are of negligible electrical resistance in comparison with the bars themselves, and in particular that the module is mechanically and chemically stable at its operating temperatures which, in the case of thermoelectric generators, vary from 300° to 800° C. according to the materials used.

Consequently serious difficulties are encountered in the compatibility of the materials in contact with the thermoelements.

In particular it must be assured that there is no diffusion, evaporation, oxidation etc. under high temperature operation over very long operating times, which could alter the doping and composition of the semiconductor.

Furthermore, thermal stresses must not compromise the semiconductor bar assembly.

The methods used include the provision of pressure contacts, the electrodeposition of low resistance metals, sputtering or diffusion welding and other similar techniques.

One of the methods used at present comprises a series of operations as given in the following list:

(1) Series assembly of P and N semiconductor bars using a resin of insulating properties.

(2) Cleaning the surfaces by sandblasting.

(3) Protecting the parts on which deposition is not to take place.

(4) Nickel plating using a Watts electrolytic bath.

(5) Copper plating using a copper sulphate bath.

(6) Lapping the copper surfaces obtained.

In another method, the basic stages are vacuum metalisation to provide a layer of gold on which a layer of nickel and then a layer of copper are deposited electrolytically.

In this series of operations, the purpose of the nickel plating is to prevent diffusion of the copper into the semiconductor, which would change its properties. The copper plating creates a layer of low electrical resistance.

If these thermoelectric modules are constructed for example using bars having a typical size of $20\times10\times5$ $mm^3$, they have initial electrical contact resistances of the order of 0.3 mΩ per junction. This resistance value however is not reproducible for any contact in the same module or for different modules. Furthermore, in order to reduce the parasitic resistances of the jumpers to these values, electrolytic deposition times for the copper layer of the order of 7-8 hours are required, which correspond to thicknesses of about 0.3 mm after compacting by lapping.

In the assembly operations, it is also necessary to make the module impermeable before electrolytic deposition, using materials compatible with the electrolytic bath.

However, the long copper deposition times lead to the impossibility in practice of making the thermoelectric module completely impermeable. In the majority of cases, incorporation of the electrolytic bath may arise, with consequent inevitable degradation of the thermoelectric properties of the semiconductors within a short time. Moreover, as a lapping operation is necessary after depositing the copper layer, stresses are inevitably introduced in the first gold layer.

A further consequence is that after the module has operated at high temperature for a certain period, the nickel becomes detached on the hot face.

A method has now been found for forming a thermoelectric module consisting of a matrix of semiconductor elements with all the mechanical and electrical connections incorporated, including the input and output terminals, by which the aforesaid disadvantages are avoided.

The bars are assembled using suitable high temperature resistant cements of thermal expansion coefficients compatible with those of the semiconductors.

The first stage then consists of assembling the bars to obtain a compact module and suitably applying the thickness of insulating cement.

It is important to reduce the quantity of insulant to a minimum to prevent longitudinal parastic thermal conductivity (thermal short circuits). To obtain accuracy and reproducibility in applying this thickness and consequent correct geometry (alignment of the elements and parallelism of the hot and cold surfaces) it is advantageous to provide a guide shoulder, constructed by a simple rapid operation using an ultrasonic perforator.

After assembling the module, this same tool can be used to make the cuts in the regions between elements which have to remain isolated.

A further advantage obtained by this means is that the aforementioned shoulders already form a conducting bridge for depositing the nickel, in the light of the precariousness and irregularity of the adhesion between gold and a possible conducting bridge in cement, as in known techniques.

The electrical and mechanical contacts between the various bars are obtained by vacuum metalising a layer of gold having a thickness of the order of 1μ, and then electro-depositing nickel having a thickness of the order of 0.01-0.03 mm. Copper plates of suitable thickness are then welded onto this latter layer by vacuum brasing using a particular alloy as described hereinafter. The thermoelectric bars, including the input and output terminals, are in this manner connected on both faces of the matrix in a single operation, using suitable positioning templates. The brasing alloy is obtained by mixing Au, Ag and Ga in predetermined proportions. This alloy has a melting point of up to 600° C. according to the percentages of the components, and is therefore suitable for thermoelectric elements both of Bi-Te-Sb and Si-Ge type.

This alloy has been prepared by the following method for Bi-Te-Sb and Bi-Te-Se thermoelements (operating temperature 300° C.), and has a melting point of 400° C.:

(a) composition by weight to give the following percentages: Au=50%, Ag=20%, Ga=30%.
(b) amalgam with hardening in one hour;
(c) successive melting operations under vacuum to purify the alloy from unamalgamated slag;
(d) trituration of the ingot obtained;
(e) sintering of the powder to obtain laminations of suitable thickness (0.2 mm).

In comparison with the already stated methods, the method heretofore described has the further advantage of preserving the parallelism of the module faces, so that the only subsequent operations on them are polishing and possible protection from oxidation. The contact resistances obtained in this manner for elements of size $20\times10\times5$ mm$^3$ are of the order of 0.2–0.3 m$\Omega$ per junction, with a tensile strength of the order of approximately 30 kg/cm$^2$.

These values are reproducible and remain unaltered after various months of testing at temperatures of approximately 300° C. The thermoelectric characteristics of the modules likewise do not vary appreciably, as can be seen from the graph shown in FIG. 3 in which the abscissa represents time in months and the ordinate represents certain thermoelectric quantities, namely the Seebeck coefficient $\Delta$, the electrical conductivity and the thermal conductivity $\square$.

For a better understanding of the present invention, the thermoelectric module is described hereinafter with reference to the accompanying figures, in which.

Figure 1:
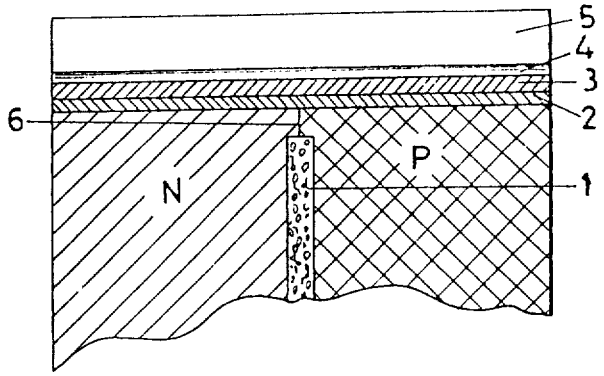
FIG. 1 is a section through the connection of the semiconductor bars.
Figure 2:
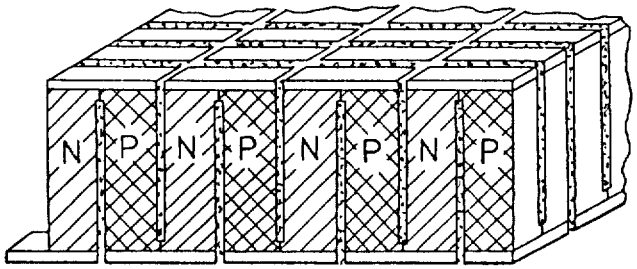
FIG. 2 is a perspective view of the thermoelectric module.
Figure 3:
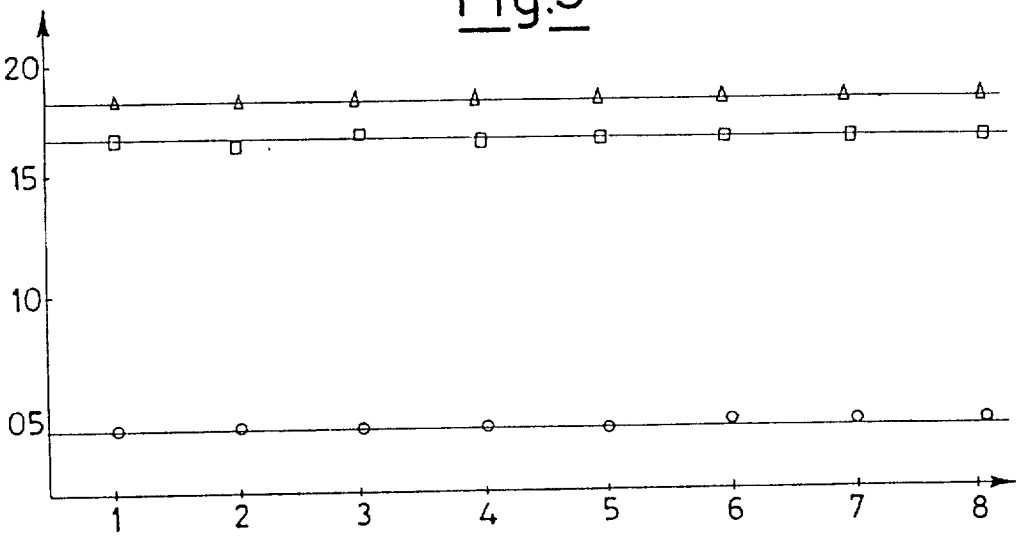
FIG. 3 is a graph of the thermoelectric characteristics of the modules.

With reference to FIG. 1, the two P and N semiconductor bars are connected together by a layer of insulating cement 1 after machining with an ultrasonic perforator to construct a shoulder projection 6.

After cleaning the surfaces by sandblasting, a gold layer 2 of a thickness of about 1$\mu$ is deposited by metalisation.

A second layer 3 of nickel of thickness 0.01–0.03 mm is deposited on the previous gold layer 2 by a Watts bath.

The copper electrode 5, positioned by templates, is then welded using the brasing alloy 4.

Finally an ultrasonic perforator is used to machine the regions between elements which are to remain isolated.

The copper electrodes are then protected by nickel or chromium plating.

What we claim is:

1. A method for constructing a thermoelectric module, comprising the following operations:
(a) constructing a reference shoulder on the semiconductor bar by an ultrasonic perforator;
(b) assembling the semiconductor bars in series, using a cement of insulating properties;
(c) cleaning the surfaces by sandblasting;
(d) gold plating to a thickness of 1$\mu$ by metalisation;
(e) nickel plating to a thickness of 0.01–0.03 mm using a Watts bath;
(f) brasing copper electrodes under vacuum using a welding alloy consisting of Au, Ag, Ga;
(g) machining the regions between elements which have to remain isolated using an ultrasonic perforator;
(h) protecting the copper electrodes by nickel or chromium plating.

2. A module constructed in accordance with the method as claimed in the preceding claim.

*3. The method in accordance with claim 1 wherein the welding alloy consists essentially of 50% Au, 20% Ag and 30% Ga.*

* * * * *